(12) United States Patent
Baudot (10) Patent No.: US 9,536,974 B2
(45) Date of Patent: Jan. 3, 2017

(54) FET DEVICE WITH TUNED GATE WORK FUNCTION

(71) Applicant: GLOBALFOUNDRIES Inc., Grand Cayman (KY)

(72) Inventor: Sylvain Henri Baudot, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/689,181

(22) Filed: Apr. 17, 2015

(65) Prior Publication Data

US 2016/0308017 A1 Oct. 20, 2016

(51) Int. Cl.

| H01L 21/32 | (2006.01) |
|---|---|
| H01L 29/49 | (2006.01) |
| H01L 29/40 | (2006.01) |
| H01L 21/265 | (2006.01) |
| H01L 29/66 | (2006.01) |
| H01L 21/02 | (2006.01) |
| H01L 21/324 | (2006.01) |
| H01L 29/417 | (2006.01) |
| H01L 21/28 | (2006.01) |
| H01L 21/3215 | (2006.01) |
| H01L 29/78 | (2006.01) |

(52) U.S. Cl.
CPC ..... *H01L 29/4966* (2013.01); *H01L 21/02532* (2013.01); *H01L 21/02595* (2013.01); *H01L 21/26586* (2013.01); *H01L 21/28088* (2013.01); *H01L 21/324* (2013.01); *H01L 21/3215* (2013.01); *H01L 29/401* (2013.01); *H01L 29/41783* (2013.01); *H01L 29/6656* (2013.01); *H01L 29/66568* (2013.01); *H01L 29/78* (2013.01)

(58) Field of Classification Search
CPC ............. H01L 21/26586; H01L 21/324; H01L 21/02532
See application file for complete search history.

(56) References Cited

U.S. PATENT DOCUMENTS

| 7,820,530 B2* | 10/2010 | Min | H01L 21/26586 438/151 |
|---|---|---|---|
| 2002/0132415 A1* | 9/2002 | Besser | H01L 21/28088 438/216 |
| 2013/0175596 A1* | 7/2013 | Cheng | H01L 27/0629 257/310 |
| 2013/0183817 A1* | 7/2013 | Mikalo | H01L 21/26586 438/525 |
| 2013/0292774 A1* | 11/2013 | Hoentschel | H01L 21/82341 257/368 |

OTHER PUBLICATIONS

Chen et al., "Demonstrating Valence Band-Edge Effective Work Function by Aluminum Implantation in High-k/Metal Gate p-MOSFET with Incorporated Fluorine," Journal of Electronic Materials, 41:1936-40, 2012.

(Continued)

*Primary Examiner* — Tran Tran
(74) *Attorney, Agent, or Firm* — Amerson Law Firm, PLLC (57) ABSTRACT

A method of forming a semiconductor device is provided including forming a gate structure comprising a metal-containing layer over a semiconductor layer and doping the metal-containing layer by tilted ion implantation.

13 Claims, 3 Drawing Sheets

(56) References Cited

OTHER PUBLICATIONS

Hosoi et al., "Comprehensive Study and Control of Oxygen Vacancy Induced Effective Work Function Modulation in Gate-First High-k/Metal Inserted Poly-Si Stacks," 2010 Symposium on VLSI Technology Digest of Papers, pp. 179-180, 2010.
Le Royer et al., "First Demonstration of Ultrathin Body c-SiGe Channel FDSOI pMOSFETs combined with SiGe(:B) RSD: Drastic Improvement of Electrostatics (Vth,p. tuning, DIBL) and Transport (u0, Isat) Properties down to 23nm Gate Length," IEEE, IEDM11-394-397, pp. 16.5.1-16.5.4, 2011.

* cited by examiner

FET DEVICE WITH TUNED GATE WORK FUNCTION

BACKGROUND OF THE INVENTION

1. Field of the Invention

Generally, the subject matter disclosed herein relates to integrated circuits, and, more particularly, to N-channel and P-channel transistor devices. More particularly, the subject matter disclosed herein relates to improved MOSFETs with tuned work functions of the gate.

2. Description of the Related Art

Integrated circuits formed on semiconductor wafers typically include a large number of circuit elements, which form an electric circuit. In addition to active devices such as, for example, field effect transistors and/or bipolar transistors, integrated circuits can include passive devices such as resistors, inductors and/or capacitors. In particular, during the fabrication of complex integrated circuits using CMOS technology, millions of transistors, i.e., N-channel transistors and P-channel transistors, are formed on a substrate including a crystalline semiconductor layer.

A MOS transistor, for example, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer.

The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, the distance between the source and drain regions, which is also referred to as channel length.

Hence, in combination with the capability of rapidly creating a conductive channel below the insulating layer upon application of the control voltage to the gate electrode, the overall conductivity of the channel region substantially determines the performance of the MOS transistors.

Polysilicon has been used as the MOSFET gate material for decades. However, as CMOS devices are scaled into the sub 50 nm regime, polysilicon gate technology issues such as gate depletion and boron penetration become more problematic. Furthermore, polysilicon has been reported to be incompatible with a number of high-k gate-dielectric candidates. For extremely scaled semiconductor devices, the conventional $SiO_2$ gate insulator material begins to exhibit excessive leakage and, therefore, cannot reliably provide a sufficient electrical isolation between the gate electrode and the underlying channel region. Therefore, alternative materials having dielectric constants greater than about 4 (referred to herein as high-k dielectrics) have been considered for use in advanced devices including advanced CMOS devices. Gate insulators made from high-k dielectrics can be made thicker than those made of $SiO_2$ without sacrificing capacity properties and thus offer the benefit of a significant reduction of leakage currents. Candidate materials include transitional metal oxides, silicates and oxynitrides, such as hafnium oxide, hafnium silicide and hafnium oxynitride.

Figure 1:
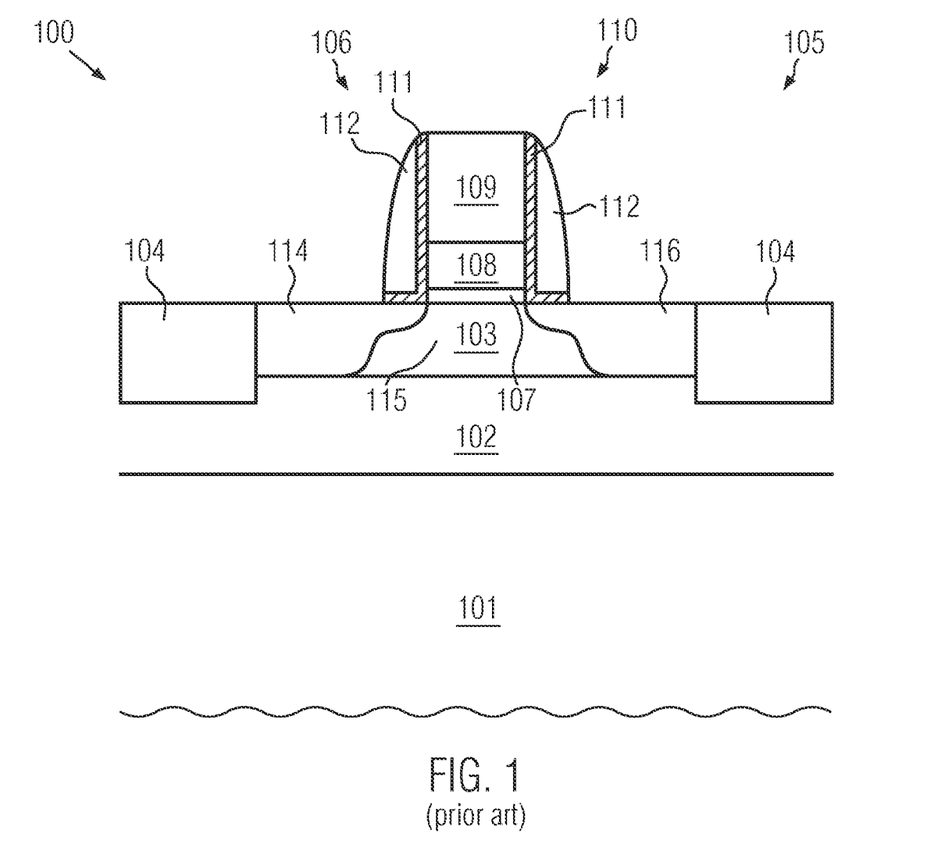
FIG. 1 illustrates an example of the manufacturing of a FET of the art.

As an example of the art, the manufacturing of a fully depleted field effect transistor (FDFET) will be described with reference to FIG. 1. Fully depleted field effect transistors are formed using a semiconductor-on-insulator (SOI) structure, wherein the semiconductor layer provided on the insulator layer has a smaller thickness than a channel depletion width. Thus, the electric charge and, accordingly, the body potential of the field effect transistor is fixed, which may be helpful for avoiding or at least reducing the floating body effect and for improving channel controllability. FIG. 1 shows a schematic cross-sectional view of a semiconductor device 100. The semiconductor structure includes a substrate 101. On the substrate 101, an electrically insulating layer 102 is formed. A semiconductor layer 103 is formed on the electrically insulating layer 102. The substrate 101, the electrically insulating layer 102 and the semiconductor layer 103 provide a semiconductor-on-insulator structure.

An isolation structure 104, for example, a shallow trench isolation structure, separates a portion of the semiconductor layer 103 wherein an active region of a fully depleted field effect transistor 105 is formed from other portions of the semiconductor layer 103 (not shown). On the semiconductor layer 103, a gate structure 106 is provided. The gate structure 106 includes a gate insulation layer 107, which may include a high-k material having a greater dielectric constant than $SiO_2$, for example, Hf, and a gate electrode 110 including a metal portion 108 and a polysilicon portion 109. Adjacent the gate electrode 110, a sidewall spacer 112 is provided, which is separated from the gate electrode 110 by a liner layer 111. The field effect transistor 105 further includes a source region 114 and a drain region 116 adjacent the gate structure 106. The source region 114 and the drain region 116 are differently doped than a channel region 115 below the gate electrode 110, and may include source and drain extensions extending below the sidewall spacer 112. These features may be formed using techniques for providing a semiconductor-on-insulator structure, including oxidation, bonding, cleaving and polishing of semiconductor wafers, and techniques for forming field effect transistors, such as deposition, oxidation, photolithography, etching and ion implantation.

In particular, the semiconductor device 100 shown in FIG. 1 includes a metal gate portion 108 that may include one or more metal-containing layers. The metal gate portion 108 includes a work function adjusting material, for example, TiN. It is known that the effective work function of the metal gate portion 108 can be adjusted by added impurities, for example.

However, in the art, the problem arises that the effective work function of the metal gate on high-k dielectric significantly decreases after high temperature anneal carried out for activation of the source/drain implants and re-crystallization of the semiconductor layer 103 in order to heal defects caused by the ion implantation resulting in the generation of the source and drain regions 114 and 116. In particular, fabricating metal gate—metal oxide—semiconductor transistor devices with low threshold voltages poses severe problems due to oxygen vacancies and defect sites in the high-k gate dielectrics, causing Fermi level pinning phenomena that severely affect the overall performance of the devices.

In view of the above, the present invention provides techniques for adjusting the work function of a metal gate wherein the above-described problems are efficiently mitigated.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to N-channel and P-channel MOSFETs. Particularly, the described method may be used for the manufacturing of FDSOI devices as FDFETs with appropriately tuned gate work functions.

A method of forming a semiconductor device is provided including forming a gate structure comprising a metal-containing layer over a semiconductor layer and doping the metal-containing layer by tilted ion implantation. By the tilted ion implantation, an effective work function of the device is appropriately tuned. The gate structure may include a gate dielectric over the semiconductor layer and below the metal-containing layer and a polysilicon layer over the metal-containing layer. Moreover, the method may include forming sidewall spacers at sidewalls of the gate structure and raised source and drain regions on the semiconductor layer. In particular, doping of the channel region and the gate dielectric by the ion implantation is avoided by the sidewall spacers and/or raised source and drain regions.

Further, a method of forming a transistor device, for example, a fully depleted FET, is provided including forming a high-k gate dielectric, a metal gate over the high-h gate dielectric and a polysilicon gate over the metal gate. Moreover, the method includes forming raised source and drain regions and doping the metal gate in the vicinity of the high-k gate dielectric by tilted ion implantation. Again, the raised source and drain regions may protect a channel region and the high-k gate dielectric from getting doped during the ion implantation process.

Furthermore, a semiconductor device is provided including a high-k gate dielectric, a metal gate over the high-h gate dielectric, a polysilicon gate over the metal gate and raised source and drain regions. The metal gate includes impurities in the vicinity of the high-k gate dielectric, for example, located in the lower third or lower fourth or lower fifth of the thickness of the metal gate only.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will, of course, be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques and semiconductor devices in which N-channel transistors and/or P-channel transistors are formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, etc., in principle. The techniques and technologies described herein may be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

This invention has a benefit on Fully Depleted CMOS technologies, since it could replace the separate back gate implant and biasing done on each device sub-type, causing a large design and processing cost. Nevertheless, this invention is not restricted to it, and could be applied on RF technologies on bulk substrates, which benefit from enhanced gate work function tuning.

A process flow for manufacturing an N-channel transistor device in accordance with an example of the present invention is described with reference to FIGS. 2, 3a, 3b and 4.

Figure 2:
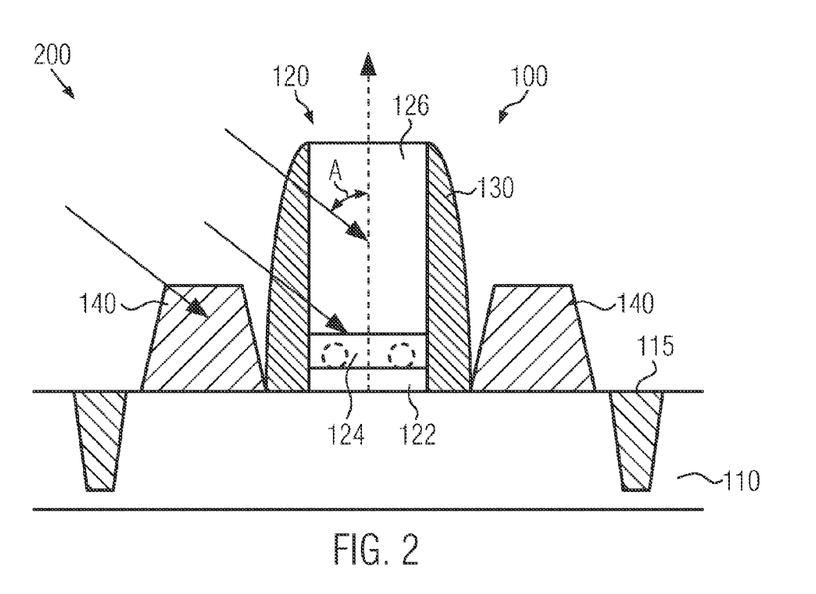
FIG. 2 illustrates a method of adjusting the work function of a metal gate of a FET according to an example of the present invention.

FIG. 2 illustrates a transistor device 100 comprising a semiconductor layer 110. The semiconductor layer 110 may be part of a semiconductor-on-insulator substrate wherein the semiconductor layer 110 is formed above a support substrate, which may be a silicon wafer, and is separated therefrom by a layer of an electrically insulating material, for example a silicon dioxide layer. The electrically insulating material may be an ultra-thin buried oxide (UT-BOX) having a thickness in a range from about 10-20 nm. The semiconductor layer 110 may be comprised of any appropriate semiconductor material, such as silicon, silicon/germanium, silicon/carbon, other II-VI or III-V semiconductor compounds and the like.

The semiconductor layer 110 may have a thickness suitable for forming a fully depleted field effect transistor, for example, a thickness in a range from about 5-8 nm. The transistor device 100 is electrically isolated from other devices formed in and above the same semiconductor layer 110 by isolation regions 115, for example, shallow trench isolations. A portion of the semiconductor layer 110 enclosed by the trench isolations 115 may provide a semiconductor feature wherein an active region of the transistor device 100 is formed, and in another portion of the semiconductor layer 110 an active region of another field effect transistor may be formed. Some or all of the trench isolations 115 may be part of a contiguous trench isolation structure.

The transistor device 100 includes a gate structure 120 that is formed on the portion of the semiconductor layer 110 enclosed by trench isolations 115. The gate structure 120 may include a gate insulation layer 122 and a gate electrode including a metal portion (metal gate) 124 and a polysilicon portion (poly gate) 126. In some embodiments, the gate insulation layer 122 may be formed of a dielectric material having a greater dielectric constant than silicon dioxide, for example, a dielectric constant greater than four. The gate insulation layer 122 may include hafnium silicon oxynitride (HfSiON) and/or hafnium dioxide ($HfO_2$).

The metal gate 124 may comprise a plurality of layers. The material of the metal portion 124 of the gate electrode may depend on whether the transistor device 100 is a P-channel transistor or an N-channel transistor. In embodiments wherein the transistor device 100 is an N-channel transistor, the metal may include La, LaN or TiN. In embodiments wherein the transistor device 100 is a P-channel transistor, the metal may include Al, AlN or TiN.

In particular, the metal gate 124 may comprise a work function adjusting material that comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm.

The gate structure 120 may further include a sidewall spacer 130 adjacent the gate electrode comprising the metal gate and poly gate. A liner layer (not shown in FIG. 2) may be provided between the gate electrode and the sidewall spacer 130. The sidewall spacer 130 may include silicon dioxide, and the liner layer may include silicon nitride. In other embodiments, the sidewall spacer 130 may include silicon nitride, and the liner layer may include silicon dioxide. The sidewall spacer 130 may have a thickness, measured in a direction perpendicular to a side surface of the gate structure 120, of about 8 nm, and the liner layer may have a thickness of about 4.5 nm, for example.

Further, the transistor device 100 may comprise raised source and drain regions 140. The source and drain regions 140 may include silicon and appropriately selected dopants.

Figure 3A:
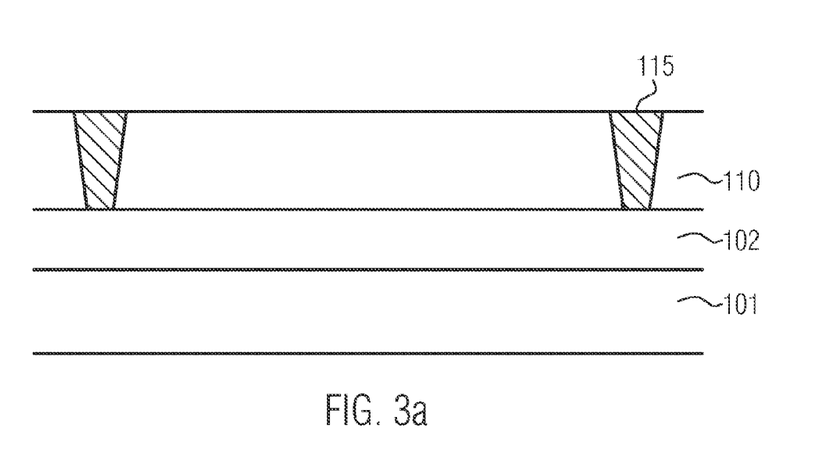
FIGS. 3a and 3b illustrate the process of manufacturing the configuration shown in FIG. 2.

The transistor device 100 illustrated may be formed by the following procedure that is described with reference to FIGS. 3a and 3b. As shown in FIG. 3a, a semiconductor-on-insulator (SOI) structure including a substrate 101, an electrically insulating layer 102 and the semiconductor layer 110 is provided. The SOI structure may be formed by means of bonding of two wafers, wherein at least one of the wafers has a layer of the dielectric material of the electrically insulating layer 102 formed thereon, cleaving one of the wafers, optionally at a location wherein hydrogen has been implanted into the wafer in order to form a weakened layer, and polishing a semiconductor material of the cleaved wafer to provide a smooth surface of the semiconductor layer 110 that is formed of a portion of the cleaved wafer. Accordingly, the well-known SMARTCUT® process may be employed. Trench isolations 115 may be formed by means of techniques for forming shallow trench isolation structures, including photolithography, etching, oxidation and deposition.

Figure 3B:
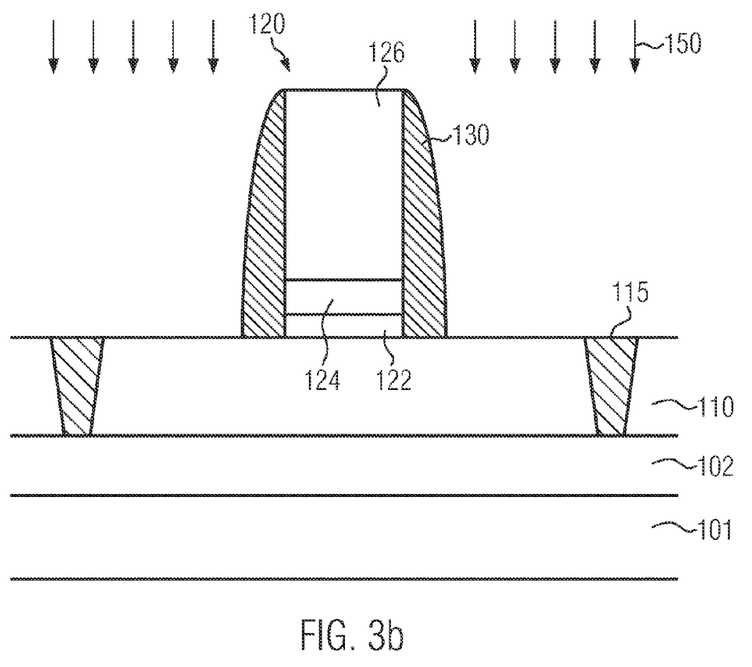

Then, a high-k gate insulation layer 122 is formed over the semiconductor layer 110, a metal gate layer 124 is formed over the high-k gate insulation layer 122 and a polysilicon gate layer 126 is formed over the metal gate layer 124 by depositing materials of the high-k gate insulation layer 122, the metal gate layer 124, and the gate layer 126, and structuring the materials by means of processes of photolithography and etching in order to obtain the gate electrode stack shown in FIG. 3b.

Sidewall spacers 130 may be formed at sidewalls of the gate structure 120. The formation of the sidewall spacers 130 may include a substantially isotropic deposition of a layer of a material of the sidewall spacers 130. A material of a liner layer may be deposited by means of a deposition technique, such as atomic layer deposition, before the deposition of the sidewall spacers 130. After the substantially isotropic deposition of the layer of the material of the sidewall spacers 130, an anisotropic etch process, for example, a reactive ion etch process, may be performed for removing portions of the layer over substantially horizontal portions of the surface of the semiconductor layer 101 and the top of the gate structure 120. The formation of the sidewall spacers 130 may comprise depositing two or more layers, for example, depositing a layer comprising silicon oxide and depositing another layer comprising silicon oxide over the layer comprising the silicon oxide material.

A semiconductor material may be deposited on portions of the semiconductor layer 110 adjacent (neighbored) to the gate structure by means of a deposition process schematically denoted by arrows 150 in FIG. 3b. The deposition process 150 may be a selective deposition process, for example, a selective epitaxial growth process, that is adapted for depositing the semiconductor material on the exposed portions of the semiconductor layer 110 adjacent the gate structure 120.

In particular, the deposition process 150 may be adapted such that substantially no semiconductor material or only a small amount of semiconductor material is deposited on silicon dioxide and/or silicon nitride. Thus, substantially no semiconductor material or only a small amount of semiconductor material is deposited on exposed portions of the trench isolation structures 115 and the sidewall spacers 130. The gate structure 120 may be covered by a top liner (not shown in FIG. 3b) made of silicon dioxide and/or silicon nitride in order to avoid deposition of the semiconductor material on top of the gate electrode. The deposition of semiconductor material on the exposed portions of the semiconductor layer 110 adjacent the gate structure by the deposition process 150 forms raised source and drain regions 140 shown in FIG. 2.

In some embodiments, the raised source and drain regions 140 may include silicon. In such embodiments, the deposition process 150 may be a selective epitaxial growth process for the selective deposition of silicon. In particular, the deposition process 150 may be a chemical vapor deposition process or a plasma-enhanced chemical vapor deposition process, wherein a reactant gas including chlorine may be used and/or wherein a chemical compound including chlorine, such as HCl, may be used in addition to a reactant including silicon. In principle, the deposition process 150 is not necessarily a chemical vapor deposition process or a plasma-enhanced chemical vapor deposition process as described above. Alternatively, molecular beam epitaxy (MBE) or metal-organic chemical vapor deposition (MOCVD) may be employed.

In some embodiments, the raised source and drain regions 140 may include a compound semiconductor material, such as silicon/germanium or silicon carbide. Deposition techniques for selectively depositing silicon/germanium or silicon carbide on the semiconductor layer 110 may include chemical vapor deposition, plasma-enhanced chemical vapor deposition, molecular beam epitaxy or metal-organic chemical vapor deposition.

Forming the raised source and drain regions 140 from a semiconductor material that is different from the material of the semiconductor layer 110 may help to provide an elastic strain in a channel region of the transistor device 100 below the gate electrode. The deposition process 150 may be adapted such that the semiconductor material of the raised source and drain regions 140 is doped. For this purpose, a dopant species, which may be a chemical compound including a dopant or a dopant in atomic or molecular form, may be supplied during the deposition process 150.

In embodiments wherein the transistor device 100 is an N-channel field effect transistor, an N-type dopant, such as phosphor (P) or arsenic (As), may be included into the semiconductor material of the raised source and drain regions 140 by supplying a dopant species such as phosphine ($PH_3$) or arsine ($AsH_3$) during the deposition process 150. In embodiments wherein the transistor device 100 is a P-channel field effect transistor, the raised source and drain regions 140 may be doped with a P-type dopant, such as boron, by supplying a dopant species such as boron, boron difluoride ($BF_2$) and/or diborane ($B_2H_6$) during the deposition process 150.

A thermal annealing process, such as a rapid thermal anneal, wherein the semiconductor structure is irradiated with radiation from a lamp or a laser, may be performed after the formation of the raised source and drain regions 140. The annealing process may be performed at a temperature in a range from about 550-700° C., and may be performed for a time in a range from about 15-45 minutes.

Such an annealing process causes a diffusion of a portion of the dopants in the raised source and drain regions 140 into a portion of the semiconductor layer 110 located below the gate structure 120. The annealing process causes formation of a source region below the raised source region and formation of a drain region below the raised drain region. Since dopants may diffuse both in a thickness direction of the semiconductor layer 110 and in lateral directions perpendicular to the thickness direction of the semiconductor layer 110 (horizontal in the plane of FIG. 2), dopants from the raised source and drain regions 140 may diffuse into portions of the semiconductor layer 110 below the sidewall spacers 130 and/or below the gate structure 120. Temperature and duration of the annealing process have to be selected such that there is a central portion below the gate structure 120 into which substantially no diffusion of dopants occurs. This central portion provides the channel region of the transistor device 100.

As illustrated by the arrows in FIG. 2, a tilted ion implantation 200 is carried out in order to implant impurities in the metal gate layer 124. Tilt refers to the angle of implantation of dopants with respect to a right angle (90°) to the substrate surface. For example, a zero degree tilt is perpendicular (right angle) to the substrate surface (parallel to a normal of the surface of the substrate), while a tilt angle A of, say, 30° is measured with respect to the perpendicular direction (that shows zero degrees). The impurities are implanted in order to adjust the effective work function in the vicinity of the interface between the gate dielectric 122 and the metal gate 124. In particular, the tilted ion implantation 200 may be performed after formation of the gate electrode structure comprising the high-k dielectric 122, the metal gate 124 and the poly gate 126 and formation of the raised source and drain regions 140.

Depending on the actual application, the impurities species can be chosen. For example, light species as fluorine or carbon may be implanted by the ion implantation process 200 in order to increase or decrease the effective work function. According to another example, aluminum may be chosen for the ion implantation process 200. It might be advantageous to choose impurities that are already active at a low thermal budget such that there is no need for dopant activation by thermal anneal. It is noted that both the tilt angle and the implantation energy have to be chosen carefully in order to introduce the impurities in the vicinity of the interface between the gate dielectric 122 and the metal gate 124 (indicated by the broken circles in FIG. 2).

A tilt angle of between 30° and 60°, for example, between 40° and 50°, may be considered appropriate. In particular, the ion implantation might not be performed through the poly gate 126. Implantation energies may range from 0.5 keV to 4 keV, for example, from 1.5 keV to 3 keV. The implantation dose may be precisely controlled for fine tuning of the work function and obtaining implantation along the entire gate length (for example, 20 nm). The implantation dose may be below $10^{15}$ $cm^{-2}$ and may range from $10^{11}$ cm$^{-2}$ to $10^{14}$ cm$^{-2}$ or $10^{12}$ cm$^{-2}$ to $10^{13}$ cm$^{-2}$, for example. By a suitable choice of impurities species and implantation dose, the work functions may be effectively controlled continuously from the N to the P Si-band edge values.

As it is illustrated in FIG. 2, the raised source and drain regions 140 together with the sidewall spacer 130 protect the channel region of the transistor device 100 as well as the gate dielectric 122 from damages by the impurities implanted by the tilted ion implantation 200. Due to the ion implantation 200, the raised source and drain regions 140 may comprise a portion of amorphous silicon. It should be noted that the ion implantation process 200 may be performed using an implantation mask that covers areas of the wafer that are not to be treated with respect to adjustment of the gate work function of a transistor device.

Figure 4:
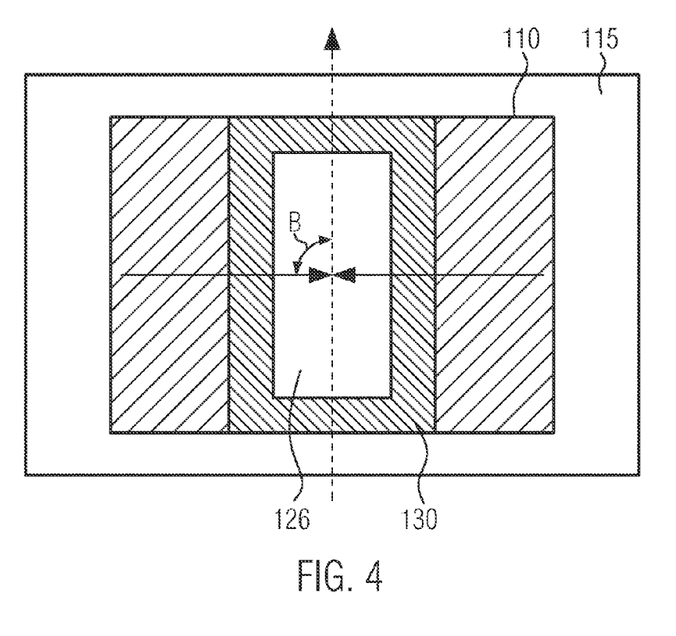
FIG. 4 illustrates twisted ion implantation of a work function adjusting species in a metal gate of a FET.

The ion implantation process 200 may be performed as a dual implantation process as illustrated in FIG. 4. A first implantation step is performed for a predetermined tilt angle and a predetermined first twist angle B. Twist (or rotate) refers to the rotation angle as seen from a top view shown in FIG. 4. As shown, for example, a twist angle of zero degrees and a twist angle of 180 degrees represent a direction parallel to the gate width, while the 90 and 270 degree twist angles represent directions that are perpendicular to the gate width (parallel to the gate length).

As can be appreciated from FIG. 4, twist angles close to zero or 180 degrees (substantially along the gate width, for example, angles between 355° and 5° or between 175° and 185°) should be avoided since such twist angles would result in undesired channel implantation by the ion implantation process 200 that merely is intended to adjust the gate work function. Since channel implantation by the tilted ion implantation 200 may be avoided, carrier mobility and overall device performance and reliability are not affected by the ion implantation 200. For example, a first implantation step may be carried out parallel to the gate length from the left side of FIG. 4. i.e., with a twist angle of 90°, and a second implantation step may be carried out from the right side of FIG. 4 parallel to the gate length, i.e., with a twist angle of 270°. The presence of the spacers 130 and raised source/drain regions 140 (see FIG. 2) prevent the gate oxide and channel from being damaged.

Well and halo regions as well as source and drain extension regions may also be implanted in the semiconductor layer 110, in principle. However, a thin undoped silicon or silicon-germanium channel may be preferred for a finally obtained FDSOI CMOS device. Lightly doped source and/or drain extension regions might be omitted. In this case, fine tuning is obtained by the ion implantation process 200 only. Moreover, the above-described method of manufacturing of a transistor device 100 is suitable for devices without embedded strained material regions, for example, embedded silicon-germanium regions formed in the semiconductor layer 110, particularly, in the channel region of the transistor device 100. Moreover, the source and drain regions 140 as well as the poly gate 126 may be silicided.

As a result of the presently disclosed subject matter, in some illustrative embodiments, an N-channel transistor or P-channel MOSFET is provided with a tuned work function of the gate. The tuning of the work function is obtained by means of a tilted ion implantation process that may allow for changing an effective work function provided by a metal gate in a range of 100-400 mV, for example. Fine tuning of some 10 mV may be achieved by suitably controlling the implantation parameters as the implantation dose and energies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming a gate structure comprising a metal-containing layer over a semiconductor layer; and
    doping said metal-containing layer by tilted ion implantation, wherein said doping is preformed by ion implantation at a first twist angle followed by ion implantation at a second twist angle different from the first twist angle in a direction opposite to said ion implantation performed at said first twist angle.

2. The method of claim 1, wherein forming said gate structure comprises forming a gate dielectric over said semiconductor layer, forming said metal-containing layer over said gate dielectric and forming a polysilicon layer over said metal-containing layer.

3. The method of claim 1, further comprising forming sidewall spacers at sidewalls of said gate structure and wherein said doping is performed through said sidewall spacers.

4. The method of claim 1, further comprising forming raised source and drain regions proximate to said gate structure before said doping.

5. The method of claim 1, wherein said doping is performed with at least one of fluorine, carbon and aluminum.

6. The method of claim 1, wherein said metal-containing layer includes titanium.

7. The method of claim 4, further comprising performing a thermal anneal for activating impurities of said raised source and drain regions before said doping.

8. The method of claim 1, wherein said doping is performed with an implantation dose of between $10^{12}$ cm$^{-2}$ and $10^{14}$ cm$^{-2}$.

9. The method of claim 1, wherein said doping is performed with a tilt angle of at least 40° with respect to a direction perpendicular to the surface of said semiconductor layer over which said metal-containing layer is formed.

10. A method of forming a transistor device, the method comprising:
    forming a high-k gate dielectric;
    forming a metal gate over said high-h gate dielectric;
    forming a polysilicon gate over said metal gate;
    forming raised source and drain regions; and
    doping said metal gate in the vicinity of said high-k gate dielectric by tilted ion implantation, wherein said doping is preformed by ion implantation at a first twist angle followed by ion implantation at a second twist angle different from the first twist angle in a direction opposite to said ion implantation performed at said first twist angle.

11. The method of claim 10, wherein said transistor device is a fully depleted FET.

12. The method of claim 10, further comprising forming sidewall spacers at sidewalls of said polysilicon gate, said metal gate and said high-k gate dielectric.

13. The method of claim 10, wherein said metal gate includes titanium and said high-k dielectric includes hafnium.

\* \* \* \* \*

UNITED STATES PATENT AND TRADEMARK OFFICE
CERTIFICATE OF CORRECTION

PATENT NO. : 9,536,974 B2
APPLICATION NO. : 14/689181
DATED : January 3, 2017
INVENTOR(S) : Sylvain Henri Baudot Page 1 of 1

It is certified that error appears in the above-identified patent and that said Letters Patent is hereby corrected as shown below:

In the Claims

Column 10, Line 19 (Claim 1, Line 6), change "preformed" to "performed".

Column 10, Line 21 (Claim 1, Line 8), change "the first" to "said first".

Column 10, Line 58 (Claim 10, Line 9), change "preformed" to "performed".

Column 10, Line 60 (Claim 10, Line 11), change "the first" to "said first".

Signed and Sealed this
Eighteenth Day of April, 2017

Michelle K. Lee
*Director of the United States Patent and Trademark Office*